United States Patent
O'Hare et al.

(10) Patent No.: US 11,379,524 B2
(45) Date of Patent: Jul. 5, 2022

(54) MULTIPLE OVERLAPPING HASHES AT VARIABLE OFFSET IN A HARDWARE OFFLOAD

(71) Applicant: EMC IP HOLDING COMPANY LLC, Hopkinton, MA (US)

(72) Inventors: Jeremy O'Hare, Westborough, MA (US); Kuolin Hua, Natick, MA (US); Ken Dorman, West Brookfield, MA (US); Anoop Raghunathan, Ashland, MA (US); Jason Duquette, Milford, MA (US); Lionel Bella, West Boylston, MA (US); Alesia Tringale, Worcester, MA (US)

(73) Assignee: Dell Products L.P., Hopkinton, MA (US)

( * ) Notice: Subject to any disclaimer, the term of this patent is extended or adjusted under 35 U.S.C. 154(b) by 406 days.

(21) Appl. No.: 16/554,802

(22) Filed: Aug. 29, 2019

(65) Prior Publication Data
US 2021/0064659 A1    Mar. 4, 2021

(51) Int. Cl.
G06F 16/30 (2019.01)
G06F 16/901 (2019.01)
H03M 7/30 (2006.01)

(52) U.S. Cl.
CPC ...... *G06F 16/9014* (2019.01); *H03M 7/3091* (2013.01)

(58) Field of Classification Search
CPC .................................................. G06F 16/9014
See application file for complete search history.

(56) References Cited

U.S. PATENT DOCUMENTS

| | | | |
|---|---|---|---|
| 2017/0123689 A1* | 5/2017 | Singhai | G06F 3/0613 |
| 2019/0026303 A1* | 1/2019 | Guerra Delgado | G06F 16/2237 |

* cited by examiner

Primary Examiner — Baoquoc N To
(74) Attorney, Agent, or Firm — Anderson Gorecki LLP

(57) ABSTRACT

A hardware offload includes a hash engine that performs hashing for a block-based storage system. The hash engine calculates multiple hash values for each input buffer provided by the storage system. The hash values may be calculated with variably offset and overlapping portions of the input buffer, wherein each portion is larger than the native block size of the storage system. The hardware offload may also include a compression engine that performs compression on the input buffer using the entire input buffer and/or chunks as compression domains.

20 Claims, 11 Drawing Sheets

MULTIPLE OVERLAPPING HASHES AT VARIABLE OFFSET IN A HARDWARE OFFLOAD

TECHNICAL FIELD

The subject matter of this disclosure is generally related to data storage, and more particularly to data deduplication and compression.

BACKGROUND

A SAN (storage area network) can be used to provide multiple host servers with block-level access to the same logical volume of storage. The SAN may include a network of compute nodes that manage access to arrays of drives. The SAN creates the logical volume of storage with contiguous LBAs (logical block addresses) and presents it to the host servers for storage of host application data that is used by instances of host applications such as block servers and email servers that run on the host servers. The host servers send block-level IO (input-output) commands to the SAN to access the logical volume. However, the host application data is maintained at non-contiguous locations on the arrays of drives. SANs have advantages over other types of storage systems in terms of potential storage capacity and scalability.

A SAN may use block-based deduplication and compression for data reduction. Because they are block-based, SANs are unaware of higher-level data structures such as files. Consequently, deduplication based on higher-level data structures may be impractical. SAN deduplication algorithms operate by identifying contiguous portions of data (chains) that are duplicated within a data set. Duplication is reduced or eliminated by replacing redundant chains with pointers to a single stored copy of the duplicated chain. Data compression algorithms operate by encoding contiguous portions of data into smaller portions of data. Both deduplication and compression can be computationally costly.

SUMMARY

All examples, aspects and features mentioned in this document can be combined in any technically possible way.

In accordance with some aspects an apparatus comprises: a hardware offload that performs hashing for a block-based storage system, comprising a hash engine that calculates multiple hash values from a single input buffer received from the block-based storage system and returns the multiple hash values to the block-based storage system. In some implementations the input buffer is larger in size than a native block of the block-based storage system. In some implementations the hash engine organizes the input buffer into multiple logical chunks and hashes each chunk. In some implementations the chunks have variable offsets. In some implementations the chunks overlap. In some implementations each chunk is larger, equal, or smaller in size than the native block. In some implementations a compression engine compresses the input buffer as a single compression domain. In some implementations a compression engine compresses each chunk as a separate compression domain. In some implementations a compression engine compresses a selected subset of the chunks, each as a separate compression domain.

In accordance with some aspects a method comprises: a block-based storage system sending a single input buffer of data of a data set to a hardware offload; the hardware offload: calculating multiple hash values from the single input buffer received from the block-based storage system; and returning the multiple hash values to the block-based storage system; and the block-based storage system using the multiple hash values to perform deduplication on the data set. Some implementations comprise creating the input buffer with a larger size than a native block of the block-based storage system. Some implementations comprise the hardware offload organizing the input buffer into multiple logical chunks and hashing each chunk to generate the multiple hash values. Some implementations comprise forming the chunks with variable offsets. Some implementations comprise forming the chunks with overlap. Some implementations comprise forming each chunk with a larger, equal, or smaller size than the native block. Some implementations comprise the hardware offload compressing the input buffer as a single compression domain to generate a compressed buffer and returning the compressed buffer to the block-based storage system. Some implementations comprise the hardware offload compressing each chunk as a separate compression domain to generate compressed buffers and returning the compressed buffers to the block-based storage system. Some implementations comprise the hardware offload compressing each chunk of a selected subset of chunks as a separate compression domain to generate compressed buffers and returning the compressed buffers to the block-based storage system.

In accordance with some aspects a system comprises: a SAN (storage area network) node that maintains a data set, the SAN node organizing the data set into input buffers that are each larger in size than a native block of the SAN node; and a hardware offload that processes individual ones of the input buffers by calculating multiple hash values and returning the multiple hash values to the SAN node, wherein the SAN node uses the multiple hash values to perform deduplication on the data set. In some implementations the hash values are calculated for chunks of the input buffer, wherein the chunks have variable offsets and overlap, and each chunk is larger, equal, or smaller in size than the native block of the SAN node.

Various other aspects, features, and implementations will be apparent in view of the detailed description and figures.

DETAILED DESCRIPTION

Figure 1:
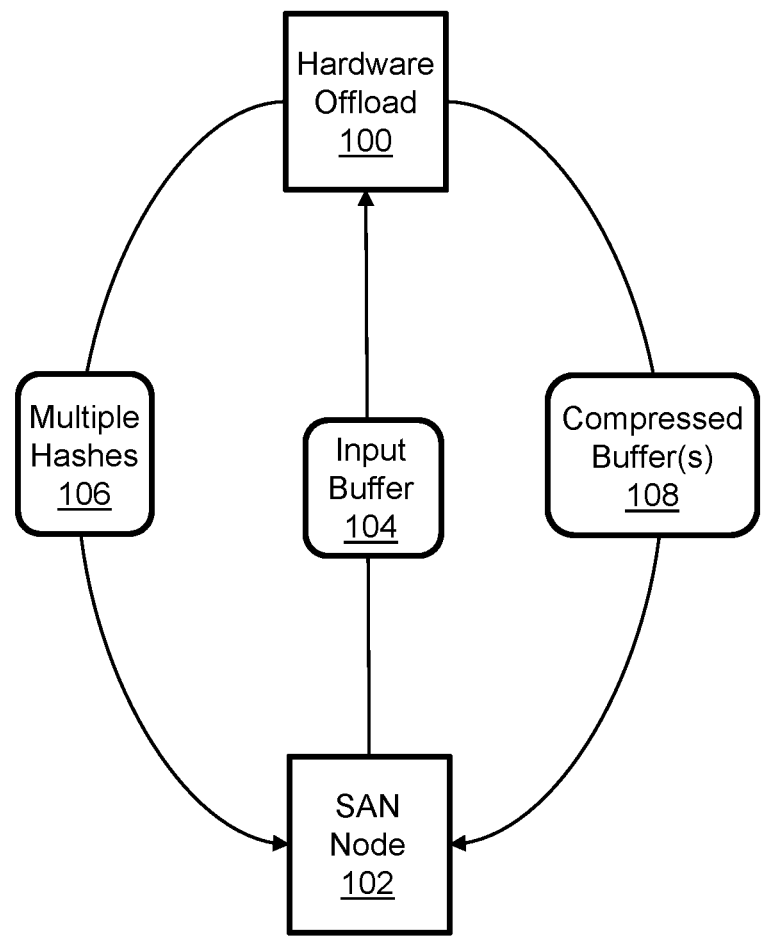
FIG. 1 illustrates a hardware offload that performs hashing and compression on data maintained by a SAN node.

Some aspects, features, and implementations described herein may include machines such as computers, electronic components, optical components, and processes such as computer-implemented steps. It will be apparent to those of ordinary skill in the art that the computer-implemented steps may be stored as computer-executable instructions on a non-transitory computer-readable medium. Furthermore, it will be understood by those of ordinary skill in the art that the computer-executable instructions may be executed on a variety of tangible processor hardware components. For ease of exposition, not every step, device, or component that may be part of a computer or data storage system is described herein. Those of ordinary skill in the art will recognize such steps, devices and components in view of the teachings of the present disclosure and the knowledge generally available to those of ordinary skill in the art. The corresponding machines and processes are therefore enabled and within the scope of the disclosure.

The terminology used in this disclosure is intended to be interpreted broadly within the limits of subject matter eligibility. The terms "logical" and "virtual" are used to refer to features that are abstractions of other features, e.g. and without limitation abstractions of tangible features. The term "physical" is used to refer to tangible non-transitory features. For example, a virtual storage device could be based on multiple physical storage drives. The term "logic" is used to refer to special purpose physical circuit elements and software instructions that are stored on a non-transitory computer-readable medium and implemented by general-purpose tangible processors.

A prior art deduplication algorithm running in a block-based storage system may hash native blocks of data to generate respective unique hash values. Each newly created hash value is compared with previously generated hash values that have been entered in a hash table or some other data structure. The existence of a matching hash value in the hash table is an indication that the block that generated the newly generated hash value is a duplicate of the block that generated the matched hash value. If a matching hash value is found in the hash table then the newly hashed block may be replaced with a pointer to the previously hashed block. The pointer requires less storage capacity than the block of data, so data reduction is accomplished. If a matching hash value is not found in the hash table, then the new hash value is entered in the hash table. Compression algorithms may also use the native block size as a basis for data reduction.

In a block-based storage system as described above, deduplication and compression efficiency and performance are a function of the native block size. The amount of metadata that must be created and managed increases as the block size decreases. Managing metadata requires processing resources so an excessively small native block size leads to poor performance due to metadata management overhead. Small native block size may also reduce compression gains in terms of data reduction. Excessively large native block size leads to poor deduplication gains in terms of data reduction. Although duplicated chains can be relatively long, matching chains are less likely to align at larger block sizes. A large block storage array could improve its deduplication efficiency by detecting and deduplicating unaligned large block chains. However, the processing overhead required to compute hash values to deduplicate unaligned large block chains may be significantly greater than the processing overhead for deduplicating aligned smaller block chains. Moreover, offload of the hashing calculations to an independent node is inhibited by the network bandwidth requirements associated with performance of additional hashes.

Referring to FIG. 1, a hardware offload 100 performs hashing to facilitate deduplication of data maintained by a SAN node 102. In some implementations the SAN node logically organizes a data set into relatively large non-overlapping buffers and each buffer, e.g. input buffer 104, is separately transmitted to the hardware offload 100 as an input buffer for hashing. The hardware offload 100 generates multiple hash values 106 from each input buffer, including input buffer 104 for example. The input buffer 104 may be relatively large in the sense of being greater in size than the native block size of the SAN node 102. Further, the multiple hashes 106 generated by the hardware offload 100 may be partially overlapping and have variable offsets. By performing overlapping hashes at variable offsets on a large input buffer, the hardware offload 100 may detect large unaligned duplicated chains while offloading the associated computational overhead from the SAN node to the hardware offload. Moreover, the performance of multiple hashes on a single input buffer helps to reduce bandwidth requirements in comparison with sending individual chunks to be hashed into individual hash values. The hardware offload may also generate compressed buffer 108 of data from the input buffer 104. As will be discussed below, the hardware offload may be local or remote relative to the SAN node.

Figure 2:
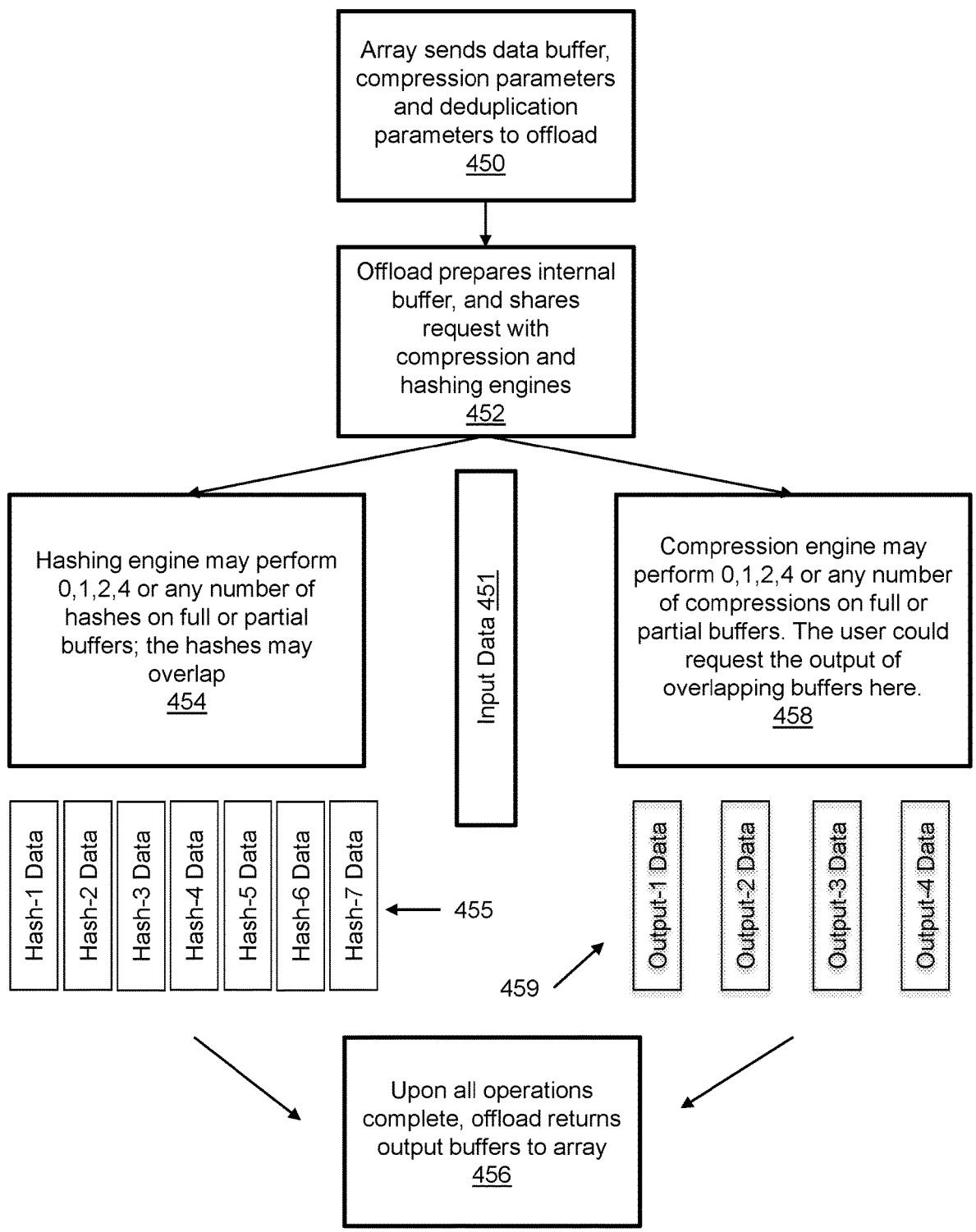
FIG. 2 illustrates processes performed by the hardware offload and SAN node.

FIG. 2 illustrates processes performed by the hardware offload and SAN node. In step 450 a storage array (an implementation of the SAN node) sends a data buffer, compression parameters and deduplication parameters to hardware offload. The data buffer contains input data 451. In step 452 the hardware offload prepares at least one internal buffer from the input buffer and shares the request with the compression engine and hashing engine. The hashing engine may perform 0, 1, 2, 4 or any number of hashes on full or partial internal buffers as indicated in step 454. Further, the hashes may overlap. The hashes are outputted as hash data 455. The compression engine may perform 0, 1, 2, 4 or any number of compressions on full or partial internal buffers as indicated in step 458. Output of overlapping buffers could optionally be selected. The compressed buffers are outputted as output 459. Upon completion of all operations, hardware offload returns output buffers to the storage array as indicated in step 456.

Figure 3:
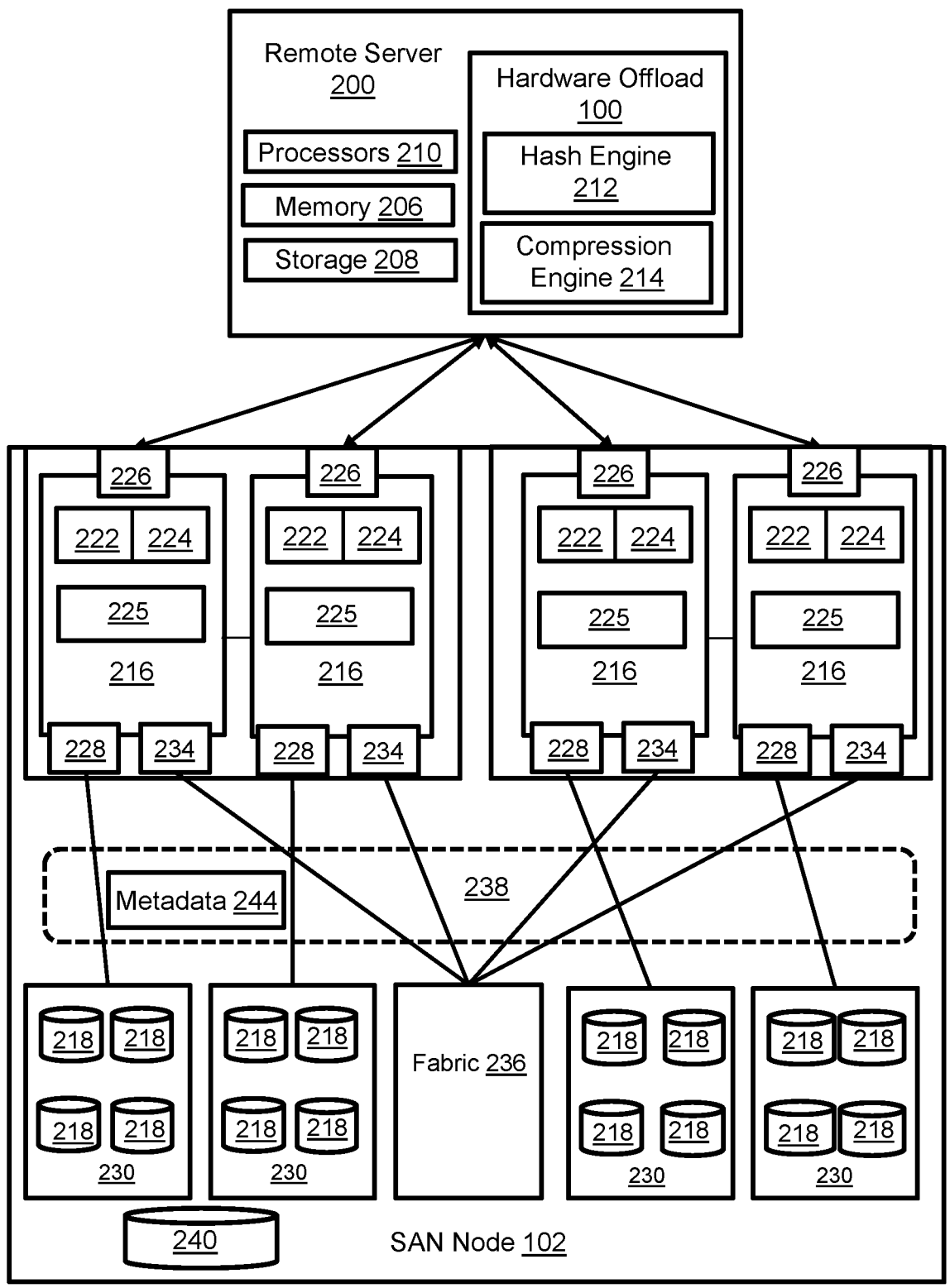
FIG. 3 illustrates an implementation of the hardware offload on a remote server.

FIG. 3 illustrates an implementation of the hardware offload 100 on a remote server 200. The remote server 200 is a computer that includes volatile memory 206, non-volatile storage 208, and one or more tangible processors 210. The volatile memory 206 may include RAM (Random Access Memory) of any type. The non-volatile storage 208 may include drives of one or more technology types, for example, and without limitation, SSDs (Solid State Drives) and HDDs (Hard Drive Drives). The processors 210 may include multi-core CPUs (central processing units) and GPUs (graphics processing units). Hash engine 212 performs hashing on the input buffers received from the SAN node. Compression engine 214 performs compression on the input buffers received from the SAN node. The hash engine and/or compression engine may include computer program code and/or specialized hardware. The remote server may be connected to the SAN node via a bus or a network such as a LAN or WAN, although this should not be viewed as limiting.

The SAN node 102 includes a plurality of interconnected computing nodes 216 that maintain data on, and control access to, managed drives 218. Each computing node includes at least one multi-core processor 222 and local volatile memory 225. The computing nodes may also include one or more layers of cache. The local volatile memory 225 may include, for example and without limitation, components such as RAM of any type. Each computing node may also include one or more FAs 226 (Front-end Adapters) for communicating with the remote server 200 and host servers that utilize data stored by the SAN node. Each computing node 216 may also include one or more BAs 228 (Back-end Adapters) for communicating with the managed drives 218 of respective associated drive arrays 230. The managed drives 218 may include tangible persistent data storage components of one or more technology types, for example, and without limitation, SSDs such as flash, SCM (Storage Class Memory), and HDDs. Each drive array 230 may include 24 or more managed drives 218, but the figure is simplified for purposes of illustration. Each computing node 216 may also include one or more CAs (Channel Adapters) 234 for communicating with other computing nodes via an interconnecting fabric 236. Each computing node may allocate a portion or partition of its respective local volatile memory 225 to a shared memory 238 that can be accessed by other computing nodes, e.g. via DMA (Direct Memory Access) or RDMA (Remote Direct Memory Access). Pairs of the computing nodes may be organized as storage engines for purposes of failover between computing nodes. The paired computing nodes of each storage engine may be directly interconnected by communication links.

One function of the SAN node 102 is to maintain data for instances of a host application running on a host server. Specifically, host application data is maintained on the managed drives 218. Examples of host applications may include but are not limited to file servers, email servers, block servers, and databases. The managed drives are not discoverable by the hosts, but the SAN node maintains a logical storage device 240 that can be discovered and accessed by the hosts. Without limitation, the logical storage device 240 may be referred to as a production volume or production LUN, where LUN (Logical Unit Number) is a number used to identify the logical storage volume in accordance with the SCSI (Small Computer System Interface) protocol. From the perspective of the hosts, the production volume 240 is a single data storage device having a set of contiguous fixed-size LBAs (logical block addresses) on which data used by instances of the host application resides. However, the host application data is stored at non-contiguous addresses on various managed drives that are abstracted by the production volume. The host application data may be deduplicated and compressed by the hardware offload 100 running on the remote server 200.

To service IOs from instances of the host application, the SAN node maintains metadata 244 that indicates, among various things, mappings between LBAs of the production volume 240 and addresses with which extents of host application data can be accessed from the shared memory 238 and managed drives 218. In response to a data access command from an instance of the host application, the SAN node uses the metadata 244 to service the command by accessing the shared memory and/or managed drives.

The native block size used by the computing nodes as the basic unit of allocation for data management is not necessarily the same block size used by the managed drives for data storage. A sector or page may be the smallest unit of storage that a managed drive processes, e.g. an HDD providing a sector in response to a read or overwriting a sector in response to a write, or an SSD reading or writing a page. On a spinning disk HDD, a track may correspond to a concentric band on the disk and a sector may be a portion of such a concentric band. 1 HDD sector may be 512 bytes in size, 1 HDD block may be 8 sectors, and 1 HDD track may be 32 sectors. The basic allocation unit used by the computing nodes, referred to herein as a block, may be 128 KB in size. The specific size of the native block should not be viewed as limiting and should not be confused with the constraints of the storage media. For example, and without limitation, the input buffer size may be 256 KB for a native block size of 128 KB. The input buffer may be organized into 32 KB chunk (internal buffers) by the hardware offload for hashing and compression may be 32 KB, and the variable offset may be 8 KB.

Although the hardware offload 100 is implemented in a remote server 200 in the illustrated example, the hardware offload could be implemented in the SAN node 102. For example, additional processors, memory and other resources within the SAN node could be used such that overhead would be offloaded from the computing nodes 216. In some implementations that hardware offload may be implemented on a card or blade.

Figure 4:
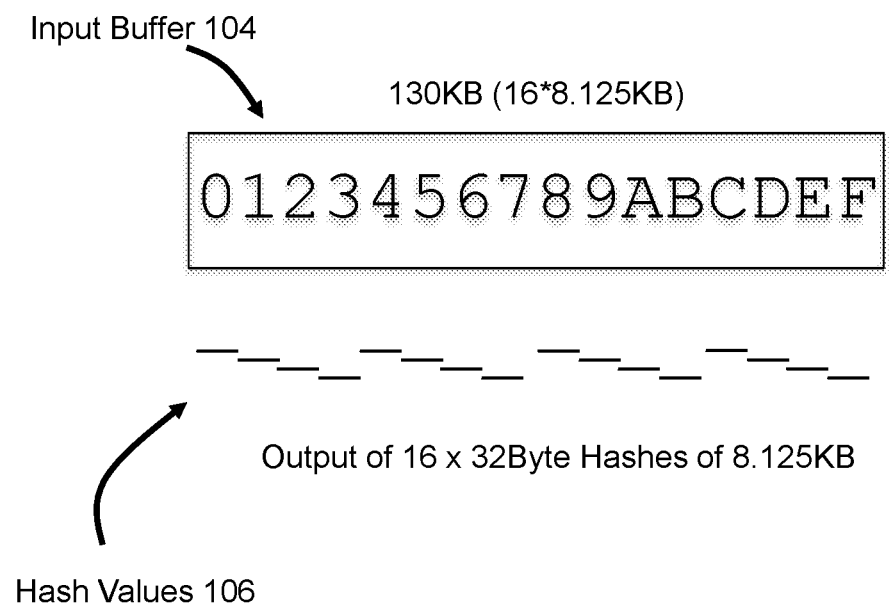
FIGS. 4 through 6 illustrate examples of hash value generation.

Referring now to FIG. 4, in the illustrated example the input buffer 104 received by the hardware offload from the SAN node and independently processed is 130 KB in size. Each native block may have an 8-byte CRC (cyclic redundancy check), resulting in a 130 KB buffer of sixteen extents 0 through F of 8.125 KB in size rather than a 128 KB input buffer with sixteen extents of 8 KB in size. However, the use of CRC should not be viewed as a limitation and the input buffer sizes described herein could be adjusted based on the absence of CRC and/or presence of other information. The hash engine running on the hardware offload separately hashes each of the sixteen 8.125 KB extents 0 through F as a separate chunk to generate sixteen non-overlapping 32 byte hash values 106 that are returned to the SAN node as output. In the illustrated example and other examples that follow the hashed chunks are represented by alignment of the output hash values 106 with the input buffer extents 0 through F.

Figure 5:
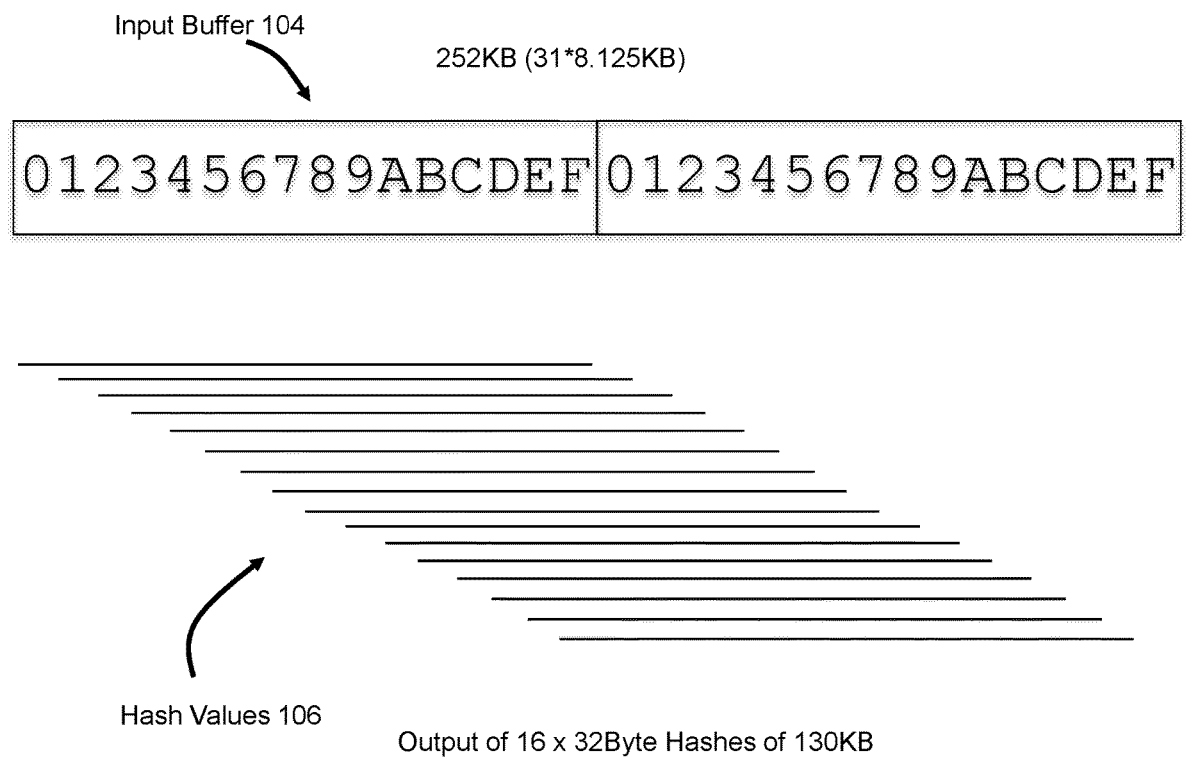

Referring now to FIG. 5, in the illustrated example each input buffer 104 is 252 KB in size (e.g. two contiguous 130 KB buffers, each with sixteen 8.125 KB extents 0 through F). The extents of the 252 KB input buffer 104 may be logically divided into sixteen overlapping chunks of 130 KB in size. The numbers and sizes are merely examples, but the chunk size will typically be larger than the native block size. The overlapping chunks may be offset by integer multiples of a fixed number of KB from a reference point of the input buffer, e.g. the increments of 8 KB (8 KB, 16 KB, etc.) from the start or first byte. The hash engine running on the hardware offload hashes each of the sixteen 130 KB overlapping chunks to generate sixteen 32 Byte hash values 106. The larger chunk size (relative to the native block size) and overlap may help to identify large unaligned duplicated chains.

Figure 6:
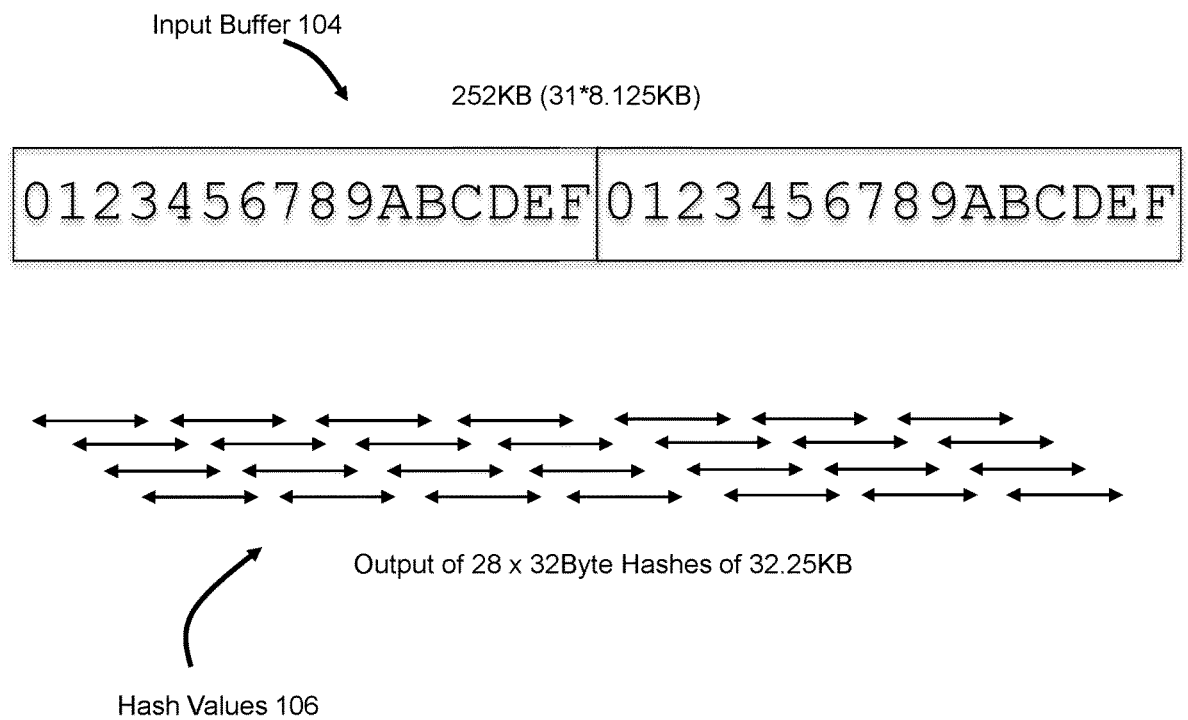

Referring now to FIG. 6, in some implementations the hardware offload calculates hashes at all offsets for which the SAN node supports deduplication. The SAN node may be constrained to deduplication at native block boundaries and/or other values and structures. In the illustrated example a 252 KB input buffer 104 is logically divided into twenty-eight overlapping variably offset chunks of 32.25 KB in size. The chunks are variably offset and overlap in accordance with the deduplication constraints of the SAN node. The hash engine running on the hardware offload hashes each of the twenty-eight 32.25 KB overlapping chunks to generate twenty-eight 32 Byte hash values 106.

Figure 7:
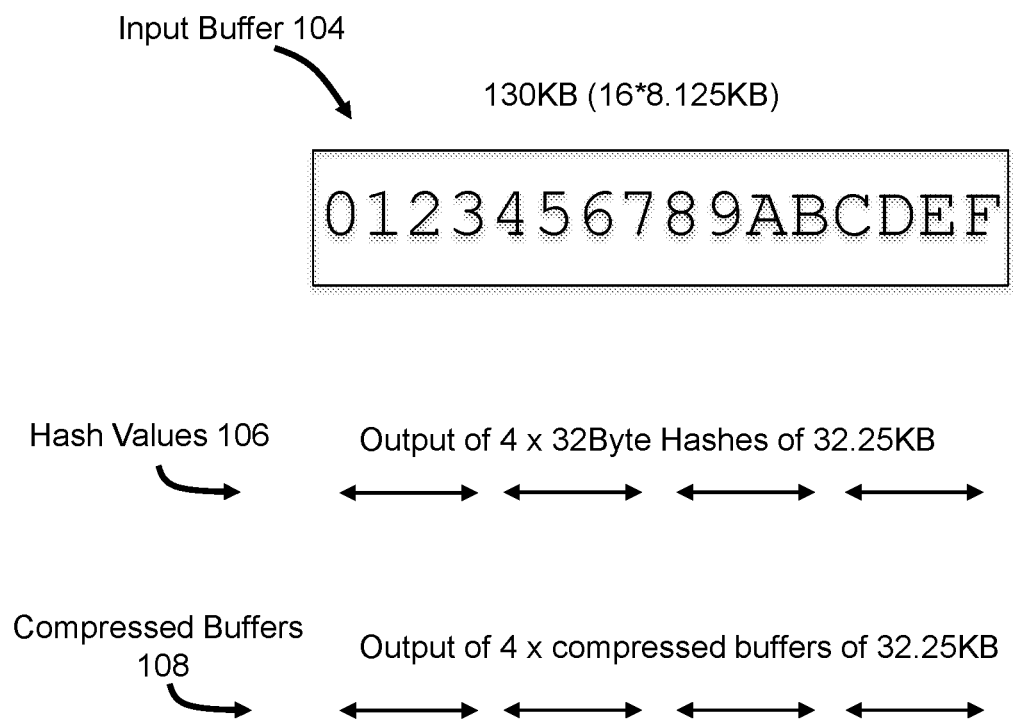
FIGS. 7 through 10 illustrate examples of generation of hash values and compressed buffers.

Referring to FIG. 7, in some implementations the hardware offload generates a compressed buffer for each logical chunk that is hashed. The hardware offload organizes the input buffer 104 into contiguous non-overlapping chunks with variable offsets in accordance with the deduplication constraints of the SAN node. In the illustrated example an input buffer of 130 KB in size is logically organized as four contiguous non-overlapping logical chunks of 32.25 KB. A separate 32 Byte hash value is calculated for each of the logical chunks, resulting in four hashes in the outputted hash values 106. Further, each logical chunk is compressed, resulting in four compressed buffers 108 of 32.25 KB (uncompressed). In other words, each chunk is a separate compression domain that can be independently decompressed. The size of the compressed buffers will depend on compression ratio and a variety of factors.

Figure 8:
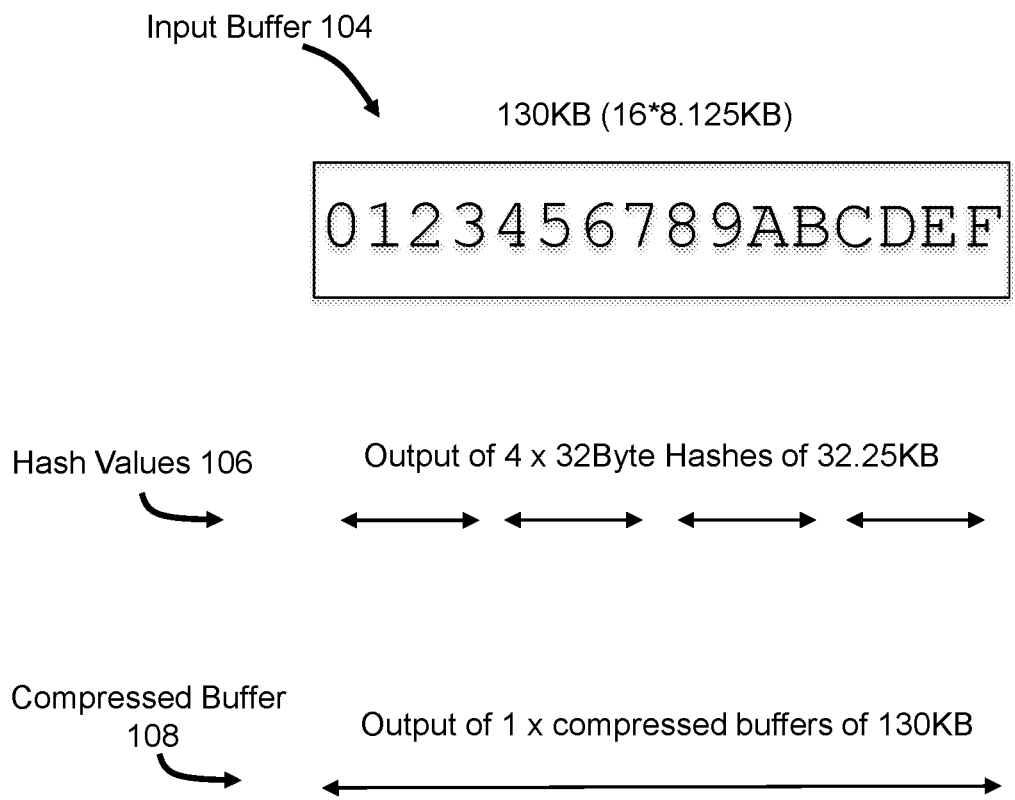

Referring to FIG. 8, in some implementations the hardware offload generates a single compressed buffer 108 using the input buffer 104 as a compression domain. In the illustrated example an input buffer of 130 KB in size is sent from the SAN node to the hardware offload. The hardware offload organizes the input buffer into four contiguous non-overlapping logical chunks of 32.25 KB using variable offsets as described above. A separate 32 Byte hash value is calculated for each of the logical chunks, resulting in four hash values 106. The entire 130 KB buffer is treated as a single compression domain, resulting in one compressed buffer of 130. KB (uncompressed) that is returned to the SAN node as the compressed chunks 108.

Figure 9:
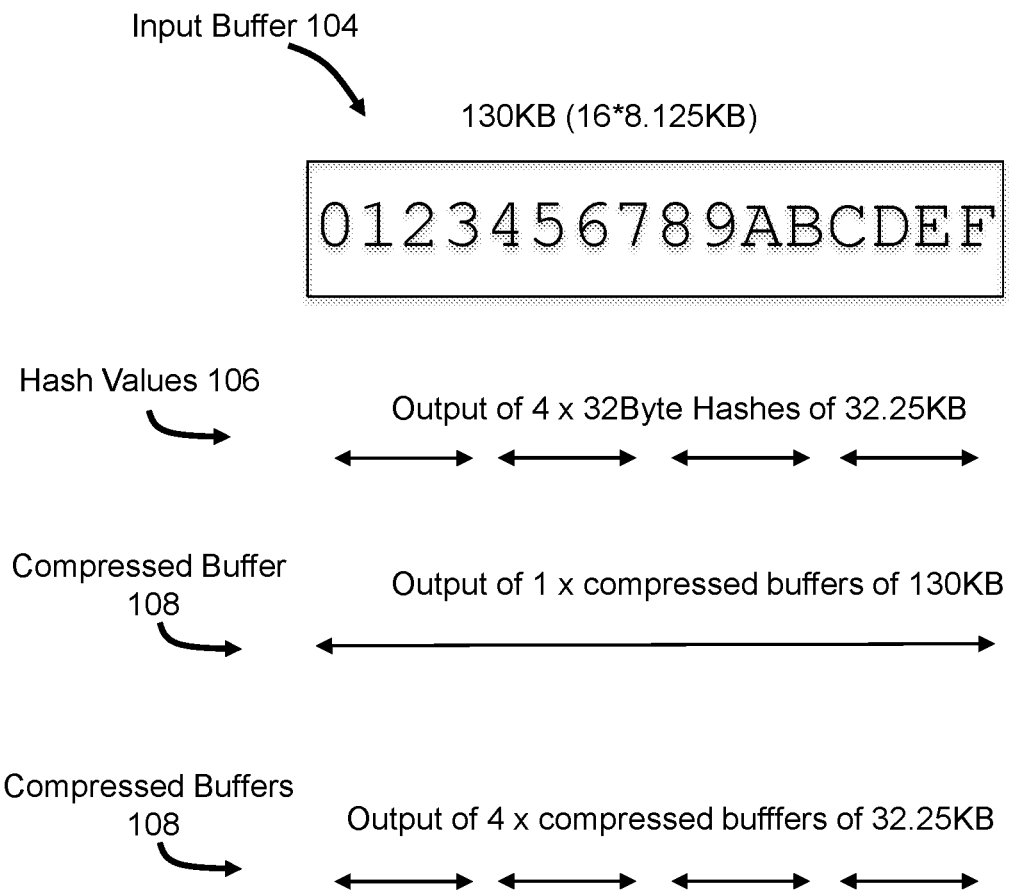

Referring to FIG. 9, in some implementations the hardware offload generates a single compressed buffer for the input buffer and generates a compressed buffer for each logical chunk that is hashed. In the illustrated example an input buffer 104 of 130 KB in size is sent from the SAN node to the hardware offload. The hardware offload organizes the input buffer into four contiguous variably offset non-overlapping logical chunks of 32.25 KB in accordance with SAN node deduplication constraints as described above. A separate 32 Byte hash value is calculated for each of the logical chunks, resulting in four hash values 106. The entire 130 KB input buffer 104 is treated as a compression domain, resulting in one compressed buffer 108 of 130. KB (uncompressed). Further, each logical chunk is treated as a separate compression domain, resulting in four compressed buffers 108 of 32.25 KB (uncompressed). The compressed buffers are returned to the SAN node.

Figure 10:
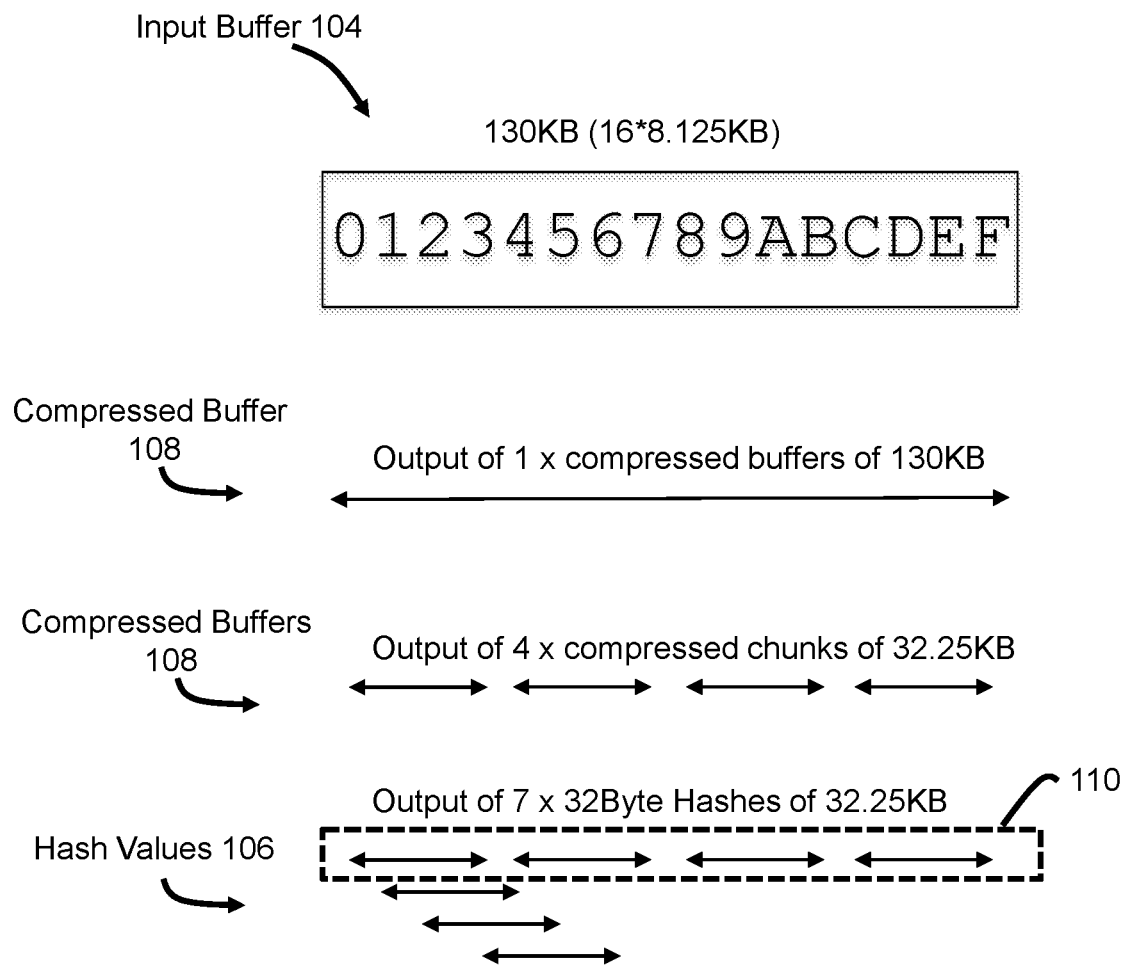

Referring to FIG. 10, in some implementations the hardware offload generates a single compressed buffer for the input buffer and generates compressed buffers for a subset of contiguous non-overlapping logical chunks of a set of overlapping chunks. In the illustrated example an input buffer 104 of 130 KB in size is sent from the SAN node to the hardware offload. The hardware offload calculates hashes at all offsets for which the SAN node supports deduplication. The chunks are variably offset and overlapping in accordance with the deduplication constraints of the SAN node. The hash engine running on the hardware offload hashes each of the chunks to generate 32 byte hash values 106. In the illustrated example the hardware offload outputs seven 32 Byte hash values corresponding to seven 32.25 KB logical chunks. The entire 130 KB input buffer is treated as a compression domain, resulting in one compressed buffer 108 of 130. KB (uncompressed). Further, each chunk of a subset 110 of hashed chunks consisting of contiguous non-overlapping logical chunks is treated as a compression domain, resulting in four compressed buffers 108 of 32.25 KB (uncompressed). The compressed buffers are returned to the SAN node.

Figure 11:
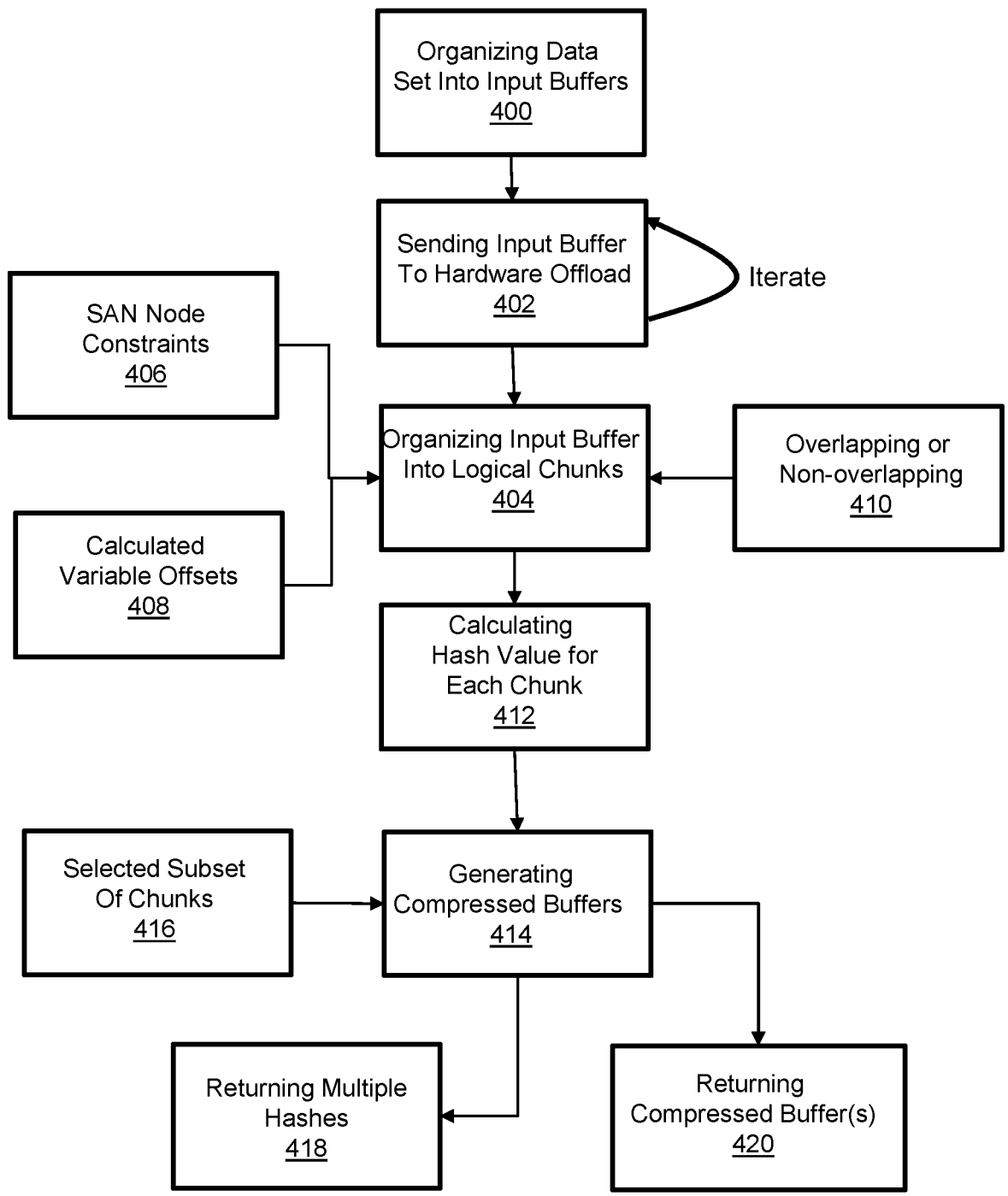
FIG. 11 illustrates steps of a method in accordance with some implementations.

FIG. 11 illustrates steps of a method in accordance with some implementations. Not all the steps are required for all implementations and the order of the steps may be rearranged. An initial step 400 may include organizing a data set into input buffers. Step 400 may be implemented by the SAN node. A subsequent step 403 is sending an input buffer to the hardware offload. Step 402 may be iterated, e.g. for each input buffer. Step 404 is organizing the input buffer into logical chunks (internal buffers). Step 404 and the other steps described below may be performed by the hardware offload. Inputs that may be used to organize the input buffer into logical chunks may include SAN node constraints 406, calculated variable offsets 408, and whether the hashes will be overlapping or non-overlapping 410. Step 412 is calculating a hash value for each chunk, thereby generating the multiple hashes. Step 414 is generating the compressed buffer(s). An input that may be used to determine how to generate the compressed buffer(s) is whether all chunks or a selected subset of chunks 416 is designated for compression. Step 418 is returning the multiple hashes to the SAN node. Step 420 is returning the compressed buffer(s) to the SAN node.

Several features, aspects, embodiments, and implementations have been described. Nevertheless, it will be understood that a wide variety of modifications and combinations may be made without departing from the scope of the inventive concepts described herein. Accordingly, those modifications and combinations are within the scope of the following claims.

What is claimed is:

1. A system comprising:
   a SAN (storage area network) node that maintains a data set, the SAN node organizing the data set into input buffers that are each larger in size than a native block of the SAN node; and
   a hardware offload that processes individual ones of the input buffers by calculating multiple hash values and returning the multiple hash values to the SAN node, wherein the SAN node uses the multiple hash values to perform deduplication on the data set.

2. The system of claim 1 wherein the hash values are calculated for chunks of the input buffer, wherein the chunks have variable offsets and overlap, and each chunk is larger, equal, or smaller in size than the native block of the SAN node.

3. A method comprising:
   a block-based storage system sending a single input buffer of data of a data set to a hardware offload;
   the hardware offload:
      calculating multiple hash values from the single input buffer received from the block-based storage system; and
      returning the multiple hash values to the block-based storage system; and
   the block-based storage system using the multiple hash values to perform deduplication on the data set.

4. The method of claim 3 comprising creating the input buffer with a larger size than a native block of the block-based storage system.

5. The method of claim 4 comprising the hardware offload organizing the input buffer into multiple logical chunks and hashing each chunk to generate the multiple hash values.

6. The method of claim 5 comprising forming the chunks with variable offsets.

7. The method of claim 5 comprising forming the chunks with overlap.

8. The method of claim 5 comprising forming each chunk with a larger, equal, or smaller size than the native block.

9. The method of claim 3 comprising the hardware offload compressing the input buffer as a single compression domain to generate a compressed buffer and returning the compressed buffer to the block-based storage system.

10. The method of claim 5 comprising the hardware offload compressing each chunk as a separate compression domain to generate compressed buffers and returning the compressed buffers to the block-based storage system.

11. The method of claim 5 comprising the hardware offload compressing each chunk of a selected subset of chunks as a separate compression domain to generate compressed buffers and returning the compressed buffers to the block-based storage system.

12. An apparatus comprising:
a hardware offload that performs hashing for a block-based storage system, the hardware offload comprising a hash engine that calculates multiple hash values from a single input buffer received from the block-based storage system and returns the multiple hash values to the block-based storage system, wherein the block-based storage system is configured to perform data reduction using the multiple hash values to identify data duplication.

13. The apparatus of claim 12 wherein the input buffer is larger in size than a native block of the block-based storage system.

14. The apparatus of claim 13 wherein the hash engine organizes the input buffer into multiple logical chunks and hashes each chunk.

15. The apparatus of claim 14 wherein the chunks have variable offsets.

16. The apparatus of claim 14 wherein the chunks overlap.

17. The apparatus of claim 14 wherein each chunk is larger, equal, or smaller in size than the native block.

18. The apparatus of claim 12 comprising a compression engine that compresses the input buffer as a single compression domain.

19. The apparatus of claim 14 comprising a compression engine that compresses each chunk as a separate compression domain.

20. The apparatus of claim 14 comprising a compression engine that compresses a selected subset of the chunks, each as a separate compression domain.

* * * * *